United States Patent
Kwak et al.

(10) Patent No.: US 9,224,462 B2
(45) Date of Patent: Dec. 29, 2015

(54) RESISTIVE MEMORY DEVICE HAVING DEFINED OR VARIABLE ERASE UNIT SIZE

(71) Applicant: SAMSUNG ELECTRONICS CO., LTD., Suwon-Si, Gyeonggi-Do (KR)

(72) Inventors: DongHun Kwak, Hwaseong-si (KR); Cheon-An Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 93 days.

(21) Appl. No.: 13/733,384

(22) Filed: Jan. 3, 2013

(65) Prior Publication Data
US 2013/0229855 A1   Sep. 5, 2013

(30) Foreign Application Priority Data
Mar. 2, 2012 (KR) .................. 10-2012-0021673

(51) Int. Cl.
G11C 11/00 (2006.01)
G11C 11/34 (2006.01)
G11C 13/00 (2006.01)

(52) U.S. Cl.
CPC ........ *G11C 13/0023* (2013.01); *G11C 13/0097* (2013.01); *G11C 2213/71* (2013.01); *G11C 2213/77* (2013.01)

(58) Field of Classification Search
USPC .......... 365/148, 163, 185.17, 185.18, 185.22, 365/185.29, 185.05, 185.11
See application file for complete search history.

(56) References Cited

U.S. PATENT DOCUMENTS

| | | | |
|---|---|---|---|
| 7,259,983 B2 * | 8/2007 | Bill et al. | 365/148 |
| 7,800,091 B2 * | 9/2010 | Kamigaichi et al. | 365/148 |
| 7,940,554 B2 | 5/2011 | Scheuerlein et al. | |
| 7,952,956 B2 * | 5/2011 | Wang et al. | 365/148 |
| 8,040,721 B2 | 10/2011 | Thorp et al. | |
| 8,040,723 B2 * | 10/2011 | Sheu et al. | 365/148 |
| 8,116,117 B2 * | 2/2012 | Cho et al. | 365/148 |
| 8,189,422 B2 * | 5/2012 | Lee et al. | 365/148 |
| 8,248,860 B2 * | 8/2012 | Lee et al. | 365/185.29 |
| 8,335,117 B2 * | 12/2012 | Kitagawa et al. | 365/148 |
| 8,634,246 B2 * | 1/2014 | Kang et al. | 365/185.17 |
| 8,654,564 B2 * | 2/2014 | Kwak et al. | 365/148 |
| 8,711,610 B2 * | 4/2014 | Seo et al. | 365/148 |
| 2004/0264244 A1 | 12/2004 | Morimoto | |
| 2008/0266942 A1 * | 10/2008 | Jeong et al. | |
| 2010/0172189 A1 | 7/2010 | Itagaki et al. | |
| 2010/0271885 A1 | 10/2010 | Scheuerlein et al. | |
| 2010/0284221 A1 * | 11/2010 | Choi et al. | |
| 2011/0002161 A1 | 1/2011 | Jin et al. | |
| 2011/0051493 A1 | 3/2011 | Baba | |

FOREIGN PATENT DOCUMENTS

| | | |
|---|---|---|
| JP | 2005025914 A | 1/2005 |
| JP | 2010161199 A | 7/2010 |
| JP | 2010225218 A | 10/2010 |
| JP | 2011054223 A | 3/2011 |
| WO | WO2006082695 A1 | 8/2006 |

\* cited by examiner

*Primary Examiner* — Trong Phan
(74) *Attorney, Agent, or Firm* — Volentine & Whitt, PLLC

(57) ABSTRACT

A resistive memory device that simultaneously erases memory cells connected to selected word line(s) included in an erase unit. The erase unit includes fewer word lines than are included in a memory block of the resistive memory device. However, erase verification may nonetheless be performed on a block basis.

14 Claims, 16 Drawing Sheets

RESISTIVE MEMORY DEVICE HAVING DEFINED OR VARIABLE ERASE UNIT SIZE

CROSS-REFERENCE TO RELATED APPLICATIONS

A claim for priority under 35 U.S.C. §119 is made to Korean Patent Application No. 10-2012-0021673 filed Mar. 2, 2012, the subject matter of which is hereby incorporated by reference.

BACKGROUND

The inventive concept relates to semiconductor memory devices, and more particularly to resistive memory devices.

Semiconductor memory devices may be classified as volatile or nonvolatile. A volatile memory device loses stored data in the absence of applied power. Examples of volatile memory devices include the static RAM (SRAM), dynamic RAM (DRAM), and synchronous DRAM (SDRAM).

In contrast, nonvolatile memory devices are able to retain stored data in the absence of applied power. Example of nonvolatile memory devices include the read only memory (ROM), programmable ROM (PROM), electrically programmable ROM (EPROM), electrically erasable and programmable ROM (EEPROM), flash memory device, phase-change RAM (PRAM), magnetic RAM (MRAM), resistive RAM (RRAM), and ferroelectric RAM (FRAM).

SUMMARY

Embodiments of the inventive concept provide a resistive memory device comprising; a memory cell array including resistive memory cells connected to word lines and bit lines and arranged in memory blocks, a row selector connected to the word lines, a column selector connected to the bit lines, an address decoder configured to decode a row address and a column address of an input address, transfer the decoded row address to the row selector, and transfer the decoded column address to the row selector, a write driver and sense amplifier block connected to the bit lines via the column selector, and control logic configured to control the row selector, the column selector, and the write driver and sense amplifier block during an erase operation to simultaneously erase memory cells connected to at least one selected word line included in an erase unit, wherein the erase unit includes fewer word lines than are included in a memory block.

Embodiments of the inventive concept provide a method of erasing resistive memory cells of a memory cell array, the memory cells being arranged in a plurality of memory blocks, each memory block including "M" word lines and "N" bit lines, M and N being positive integers, and the method comprising; simultaneously erasing a first group of memory cells connected to at least one selected word line included in an erase unit, wherein the erase unit includes "P" selected word lines and "Q" bit lines, wherein at least one of P being less than M and Q being less than N is true, and thereafter verifying that a second group of memory cells has been erased, wherein the second group is greater than the first group.

Embodiments of the inventive concept provide a resistive memory device, comprising; a memory cell array of resistive memory cells arranged in a first mat and a second mat, wherein the first mat and second mat are capable of independently performing operations, a power supply commonly providing power to the first mat and second mat, and control logic that controls the simultaneous erasure of memory cells in an erase unit defined for the first mat, while executing another operation in relation to memory cells of the second mat, wherein the power supply is capable of providing remaining available power capacity to the first mat while reserving power capacity sufficient for execution of the another operation, and the control logic is configured to dynamically adjust a size of the erase unit in response to the available power capacity.

BRIEF DESCRIPTION OF THE DRAWINGS

Certain embodiments of the inventive concept are described hereafter with reference to the accompanying drawings.

DETAILED DESCRIPTION

Figure 1:
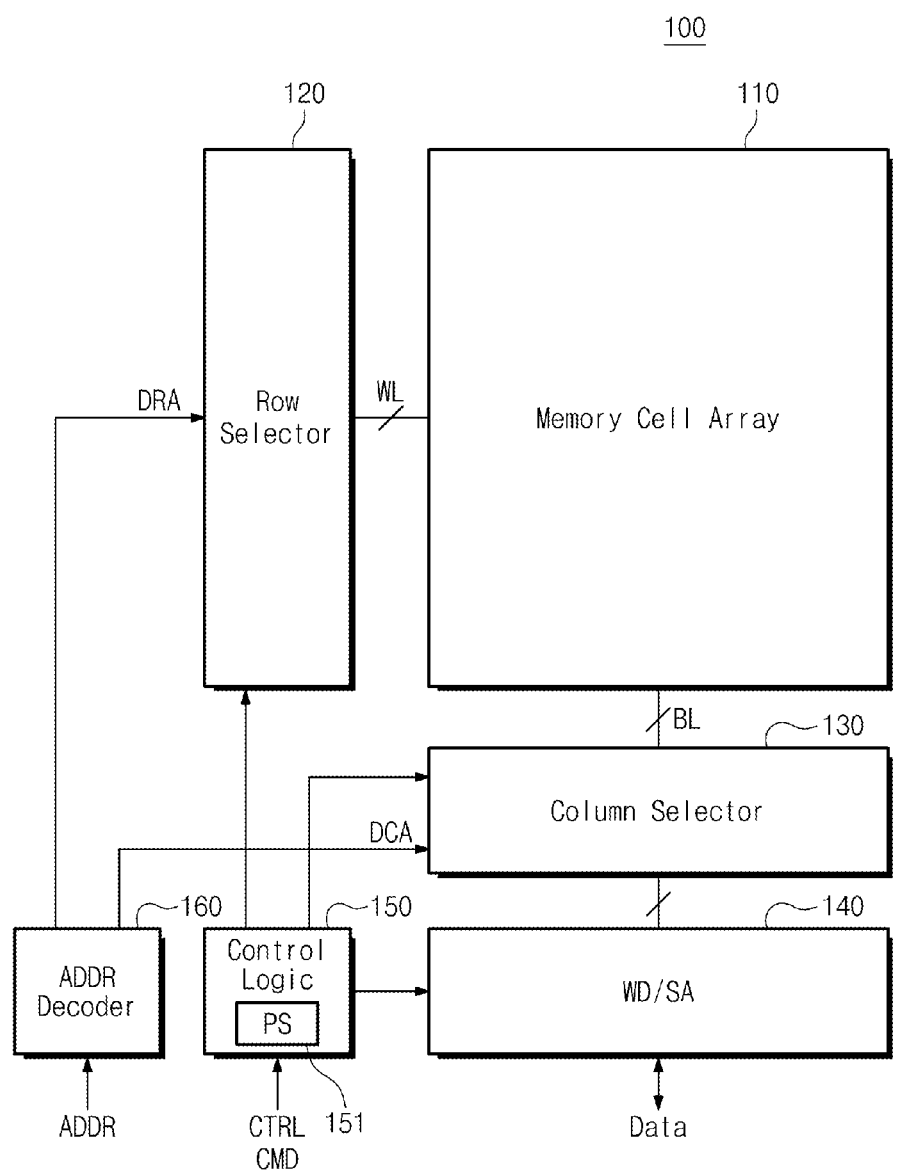
FIG. 1 is a block diagram illustrating a resistive memory device according to an embodiment of the inventive concept.

Embodiments of the inventive concept will now be described in some additional detail with reference to the accompanying drawings. The inventive concept may, however, be embodied in various different forms and should not be construed as being limited to only the illustrated embodiments. Rather, these embodiments are provided as examples so that this disclosure will be thorough and complete, and will fully convey the concept of the inventive concept to those skilled in the art. Thus, conventionally understood processes, elements, and techniques may not be described in detail as part of the following description. Unless otherwise noted, like reference numbers and labels denote like or similar elements throughout the drawings and written description. In the drawings, the size(s) and relative size(s) of certain layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

A "selected" bit (or word) line is bit (word) line connected to a cell transistor that is programmed, erased, or read by a current operation, while an "unselected" bit (or word) line is a bit (word) line connected to a cell transistor that is not programmed, erased, or read by the current operation. Multiple bit (word) lines may be selected or unselected by an operation.

A "selected" memory cell(s) is a memory cell (or group of memory cells) to be programmed, erased, or read by a current operation, while an "unselected" memory cell is all other (remaining) memory cells among a given plurality of memory cells, excepting the selected memory cell(s).

The embodiments of the inventive concept described hereafter are directed to resistive memory devices (ReRAM). However, those skilled in the art will understand that the inventive concept is not limited to only ReRAM but extends to other types of resistive memory devices. For example, the scope of the inventive concept encompasses various nonvolatile memory devices such as Electrically Erasable and Programmable ROM (EEPROM) devices, NAND flash memory devices, NOR flash memory devices, Phase-change RAM (PRAM) devices, Magnetic RAM (MRAM) devices, Ferroelectric RAM (FRAM) devices, and the like.

Figure (FIG.) 1 is a block diagram illustrating a resistive memory device according to an embodiment of the inventive concept. Referring to FIG. 1, a resistive memory device 100 comprises a memory cell array 110, a row selector 120, a column selector 130, a write driver and sense amplifier block (WD/SA) 140, control logic 150, and an address decoder 160.

The memory cell array 110 may be connected to the row decoder 120 via word lines and to the column selector 130 via bit lines. The memory cell array 110 may include a plurality of memory cells. In the illustrated embodiment, memory cells arranged in a row direction may be connected to word lines WL, and memory cells arranged in a column direction may be connected to bit lines BL. The memory cell array 110 may include multiple memory cells each capable of storing one or more bits of data.

The row selector 120 may be connected to the memory cell array 110 via the word lines WL. The row selector 120 may operate responsive to the control of the control logic 150. The row selector 120 may select the word lines WL in response to a decoded row address DRA from the address decoder 160. The row selector 120 may be supplied with power (e.g., a voltage or a current) from the control logic 150 to transfer it to the word lines WL.

The column selector 130 may be connected to the memory cell array 110 via the bit lines BL. The column selector 130 may operate responsive to the control of the control logic 150. The column selector 130 may select the bit lines BL in response to a decoded column address (DCA) from the address decoder 160. The column selector 130 may be supplied with power (e.g., a voltage or a current) from the control logic 150 to transfer it to the bit lines BL.

The write driver and sense amplifier block 140 may be connected to the bit lines BL via the column selector 130. The write driver and sense amplifier block 140 may operate responsive to the control of the control logic 150. The write driver and sense amplifier block 140 may be configured to write data at memory cells connected to bit lines selected by the column selector 130 or to read data therefrom. Data read by the write driver and sense amplifier block 140 may be output to an external device. Data provided to the write driver and sense amplifier block 140 may be written at memory cells.

The control logic 150 may be configured to control an overall operation of the resistive memory device 100. The control logic 150 may operate responsive to input control signal (CTRL) and command (CMD). The control logic 150 may control reading, writing, or erasing of the resistive memory device 100.

The control logic 150 may include a power supply (PS) 151. Power (e.g., a voltage or a current) generated by the power supply of the control logic 150 may then be supplied to the row selector 120, column selector 130, or write driver and sense amplifier block 140. Writing, reading, or erasing of memory cells may be executed using a power generated by the power supply 151.

The address decoder 160 may decode a row address of an input address (ADDR) to provide it to the row selector 120. The address decoder 160 may decode a column address of the input address to provide it to the column selector 130.

Figure 2:
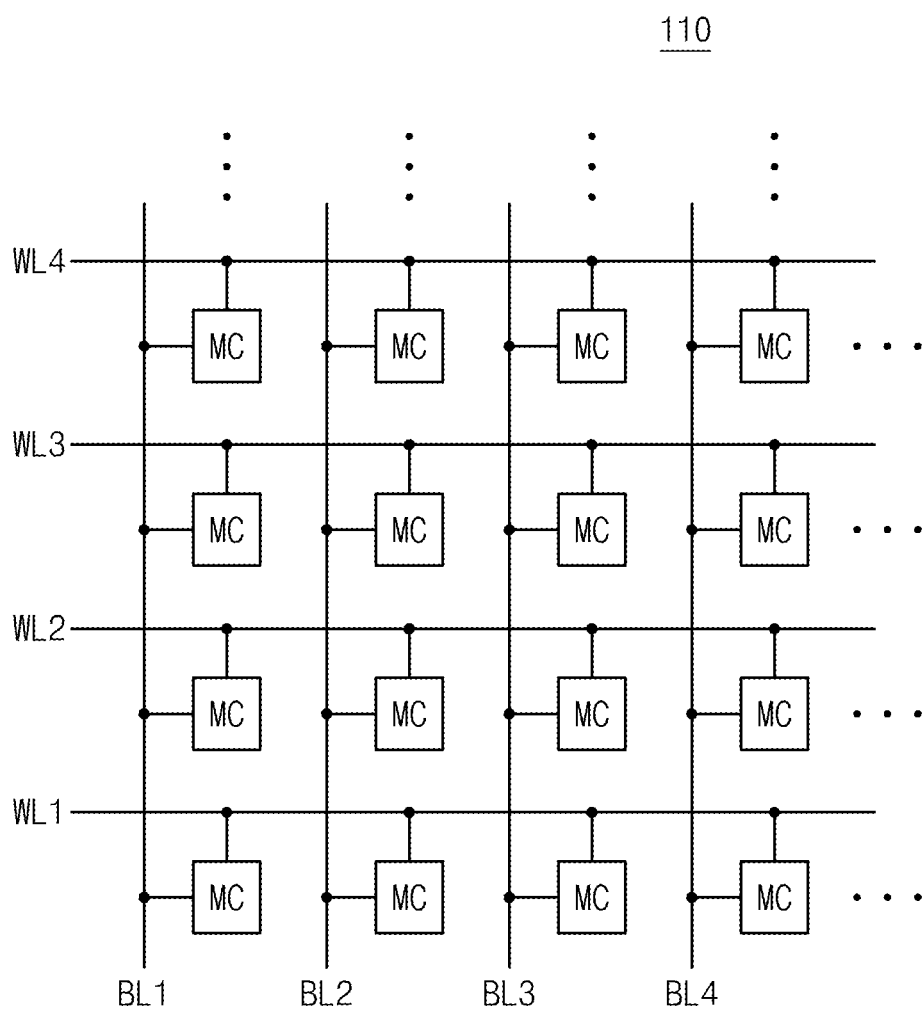
FIG. 2 is a connection diagram illustrating a portion of the memory cell array of FIG. 1.

FIG. 2 is a connection diagram further illustrating a portion of the memory cell array 110 of FIG. 1. Referring to FIG. 2, memory cells (MC) may be connected to word lines WL1 to WL4 and bit lines BL1 to BL4. The memory cells MC may be provided at intersections of the word lines WL1 to WL4 and the bit lines BL1 to BL4, respectively. In FIG. 2, there is illustrated an example that memory cells MC are connected to four word lines WL1 to WL4 and four bit lines BL1 to BL4, but those skilled in the art will recognize that this is merely a small, exemplary portion of the memory cell array 110. Those skilled in the art will also recognize that other connection schemes may be used in other memory cell arrays that may be incorporated in embodiments of the inventive concept.

Figure 3:
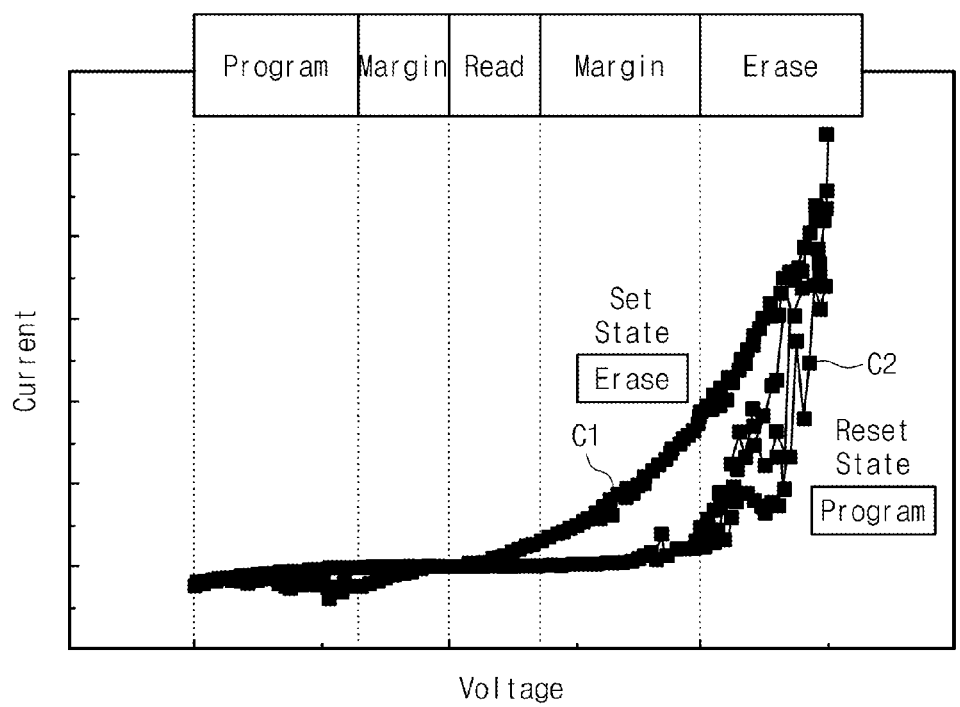
FIG. 3 is a graph illustrating certain voltage/current relationships for memory cells that may be used in the embodiment of FIGS. 1 and 2.

By way of further background, FIG. 3 is a graph illustrating certain hysteresis curves. These "curves" connect data plot for voltage-current relationships exhibited by memory cells that may be incorporated within the memory cell array of FIGS. 1 and 2. In FIG. 3, the horizontal axis indicates voltage and the vertical axis indicates current. The voltage-current relationships of FIG. 3 vary according to the state (set and reset) of the memory cells MC and various operations being executed in relation to the memory cell array. In FIG. 3, "Program" indicates a zone where a memory cell is programmed. When the memory cell is in a voltage or current status corresponding to the program zone, the memory cell is programmed. "Erase" indicates a zone where a memory cell is erased. When the memory cell is in a voltage or current status corresponding to the erase zone, the memory cell is erased. Between the program and erase zones, the memory cell is not programmed or erased. Thus, a resistance value of the memory cell may be estimated (e.g., read) while not destructing the programmed or erased status of the memory cell. However, to completely prevent a destructive read, a voltage or current zone indicated as "Margin" that is adjacent to the program zone or the erase zone is not used for a read.

A first curve C1 illustrates voltage-current conditions for memory cells having a set state (e.g., an erase state), while a second curve C2 illustrates voltage-current conditions for memory cells having a reset state (e.g., a program state).

When a read voltage (e.g., a voltage provided during the read period) is applied to the memory cells MC, the amount of a current flowing through a "set" memory cell MC may be greater than that flowing through a "reset" memory cell. That is under certain conditions, a reset memory cell MC will exhibit a resistance value that is greater than that of a set memory cell MC.

When an erase voltage (e.g., a voltage provided during the erase period) is applied to a reset memory cell MC, it then transitions to the set state. Alternatively, when a current corresponding to the erase voltage is applied to a reset memory cell MC, it then transitions to the set state.

When a program voltage (e.g., a voltage provided during the program period) is applied to a set memory cell MC, it then transitions to a reset state. Alternatively, when a current corresponding to the program voltage is applied to a set memory cell MC, it then transitions to the reset state.

In relation to the illustrated embodiments, a voltage bias used during memory cell programming may be opposite polarity to a voltage bias during memory cell erasing. During programming, a word line voltage may be less than a bit line voltage. During erasing, a word line voltage may be greater than a bit line voltage.

Similarly, a current bias used during programming may be opposite to a current bias during erasing. During programming, a current may flow to a word line from a bit line via a memory cell. During erasing, a current may flow to a bit line from a word line via a memory cell.

Figure 4:
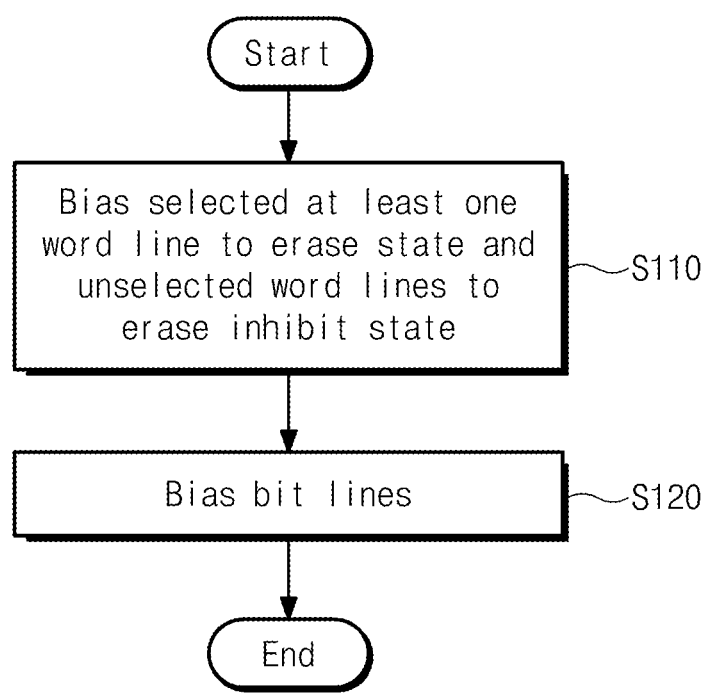
FIG. 4 is a general flowchart summarizing an erase method according to an embodiment of the inventive concept.

FIG. 4 is a general flowchart summarizing an erase method according to an embodiment of the inventive concept. Referring to FIG. 4, an erase method may include biasing at least one selected word line to an erase state and unselected word lines to an erase inhibit state (S110), and biasing the bit lines (S120).

Figure 5:
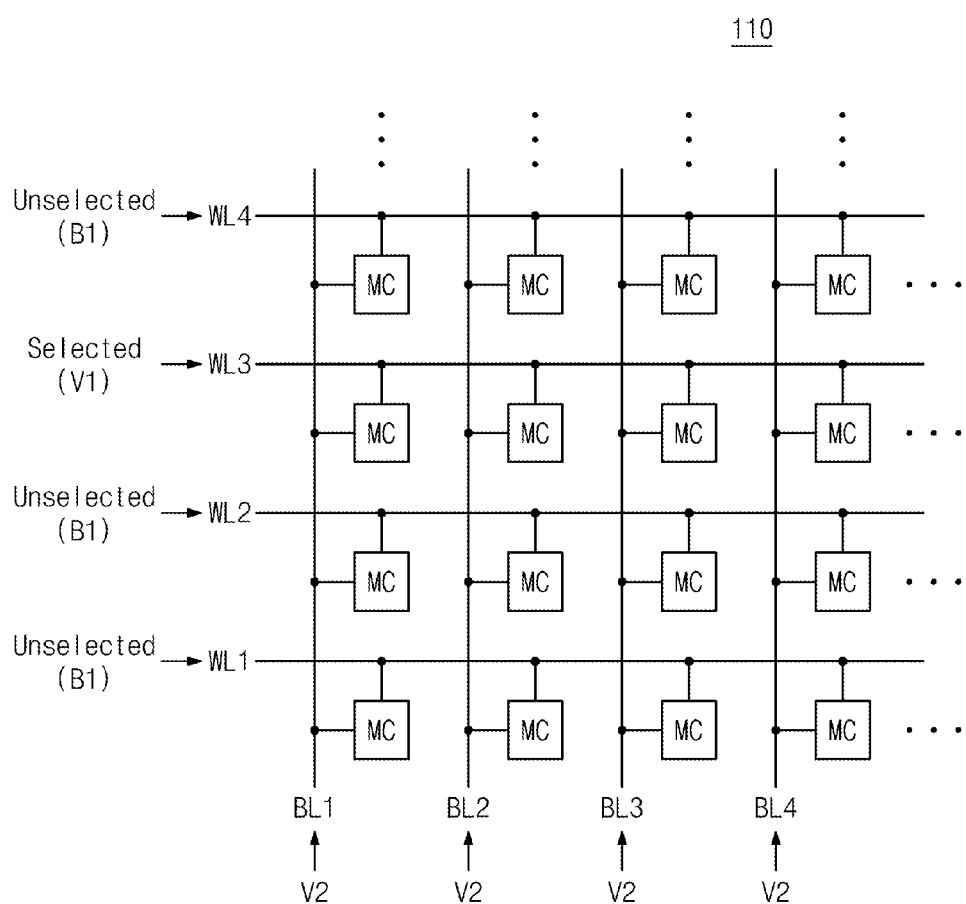
FIGS. 5 and 6 are respective annotated connection diagrams describing certain bias condition(s) for the memory cell array of FIG. 2 in relation to execution of the erase method of FIG. 4.
Figure 6:
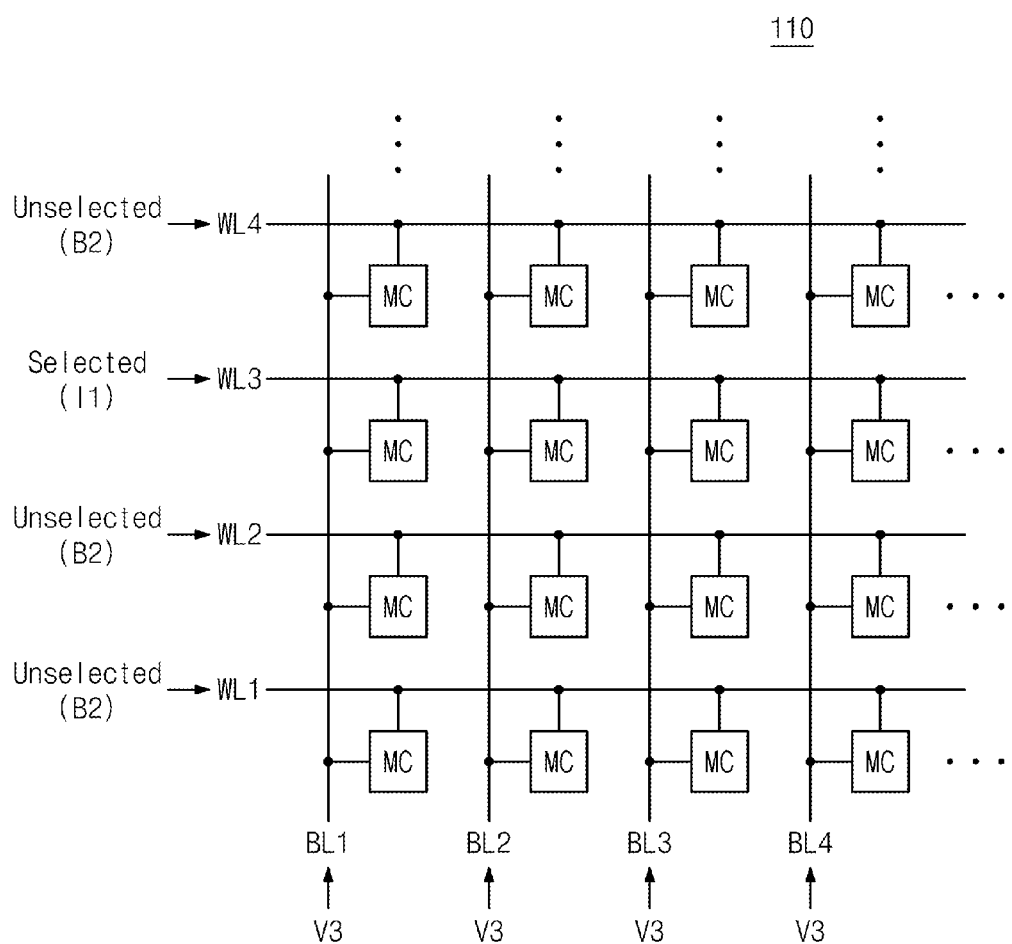

FIGS. 5 and 6 are respective annotated connection diagrams describing certain bias condition(s) for the memory cell array of FIG. 2 in relation to execution of the erase method of FIG. 4. In the illustrated examples, it is assumed that the third word line WL3 is a selected word line.

Referring to FIG. 5, a first voltage V1 is applied to the selected third word line WL3. A second voltage V2, less than the first voltage V1, is applied to bit lines BL1 to BL4. Under these bias conditions, current flows to the bit lines BL1 to BL4 from the third word line WL3 via memory cells MC connected to the third word line WL3, and the memory cells MC connected to the third word line WL3 are erased by the applied voltages.

Unselected word lines WL1, WL2, and WL4 are biased to a first (non-erase) bias state B1 such that memory cells MC connected to the unselected word lines WL1, WL2, and WL4 are not erased. In certain embodiments of the inventive concept, the first (non-erase) bias state is a floating state or a state that a specific voltage (e.g., the second voltage V2) is supplied.

After the memory cells MC connected to the third word line WL3 are erased, another one or more word line(s) WL1, WL2, or WL4 may be selected, and the related memory cells MC erased. For example, as the plurality of word lines WL1 to WL4 is sequentially selected one by one, all of memory cells MC connected to the selected word line may be simultaneously erased.

In contrast, certain conventional methods used to erase resistive memory cells MC on a "memory block basis" will simultaneously erase all of the memory cells MC connected to word lines WL1 to WL4. Such conventional erase methods, however, generate very high peak current levels.

In contrast, certain embodiments of the inventive concept may divide a memory cell array into multiple "erase units" lesser in size than an entire memory block. For example, an erase unit may be defined as a group of memory cells connected to one or more word line(s) of a memory block. Accordingly, the level of peak current required during an erase operation directed to an erase unit is considerably less than the peak current required to erase an entire memory block. As a result, the peak current capacity of the power supply 151 (FIG. 1) may be reduced, and the overall complexity and/or size of the power supply 151 may be commensurately reduced.

In FIG. 5, there is illustrated an example that a word line WL3 is selected. However, a number of word lines may be selected for simultaneous erasure, so long as requisite peak current remains below a given design parameter. In certain embodiments of the inventive concept, the number of selected word lines to be simultaneously erased may be controlled by a combination of control logic 150, address decoder 160, and row decoder 120.

FIG. 6 is another connection diagram describing different bias condition(s) for the memory cell array of FIG. 2 in relation to the erase method of FIG. 4. Here again, it is assumed that the third word line WL3 is selected.

Referring to FIG. 6, a first current I1 is applied to the third word line WL3. A third voltage V3 may be applied to bit lines BL1 to BL4. The third voltage V3 may be a ground voltage or a specific voltage. Under these bias conditions, current may flows to the bit lines BL1 to BL4 from the third word line WL3 via memory cells MC connected to the third word line WL3, and the memory cells MC connected to the third word line WL3 are erased.

Unselected word lines WL1, WL2, and WL4 may be biased to a second (non-erase) bias state B2 such that memory cells MC connected to the unselected word lines WL1, WL2, and WL4 are not erased. As above, the second bias state B2 may be a floating state or a state that a specific voltage (e.g., the third voltage V3) is supplied.

Once the memory cells MC connected to the third word line WL3 are erased, one or more of the other word line WL1, WL2, or WL4 may be selected, and the connected memory cells MC erased. That is, as the plurality of word lines WL1 to WL4 are sequentially selected one by one, memory cells MC connected to the selected word line may be simultaneously erased.

Figure 7:
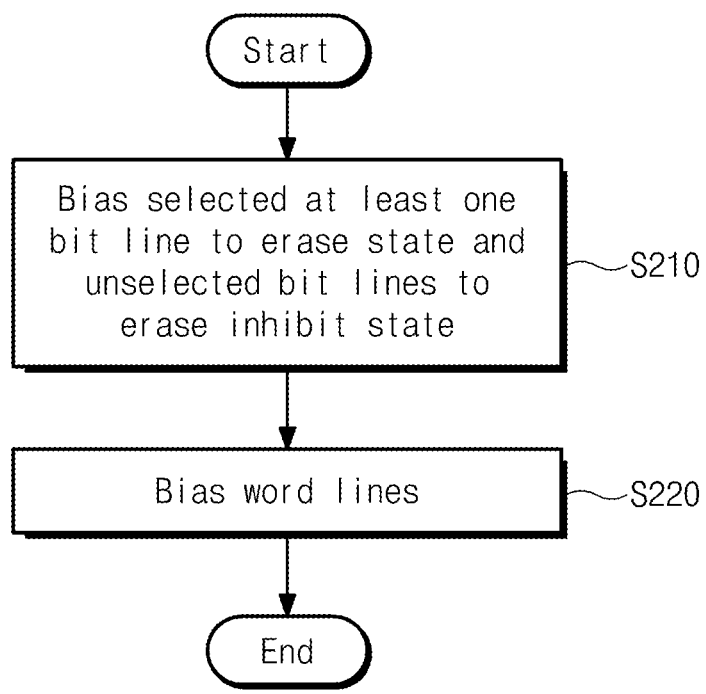
FIG. 7 is a general flowchart summarizing an erase method according to another embodiment of the inventive concept.

FIG. 7 is a general flowchart summarizing an erase method according to another embodiment of the inventive concept. Referring to FIG. 7, an erase method includes biasing at least one bit line selected to an erase state (S210); and biasing word lines (S220).

Figure 8:
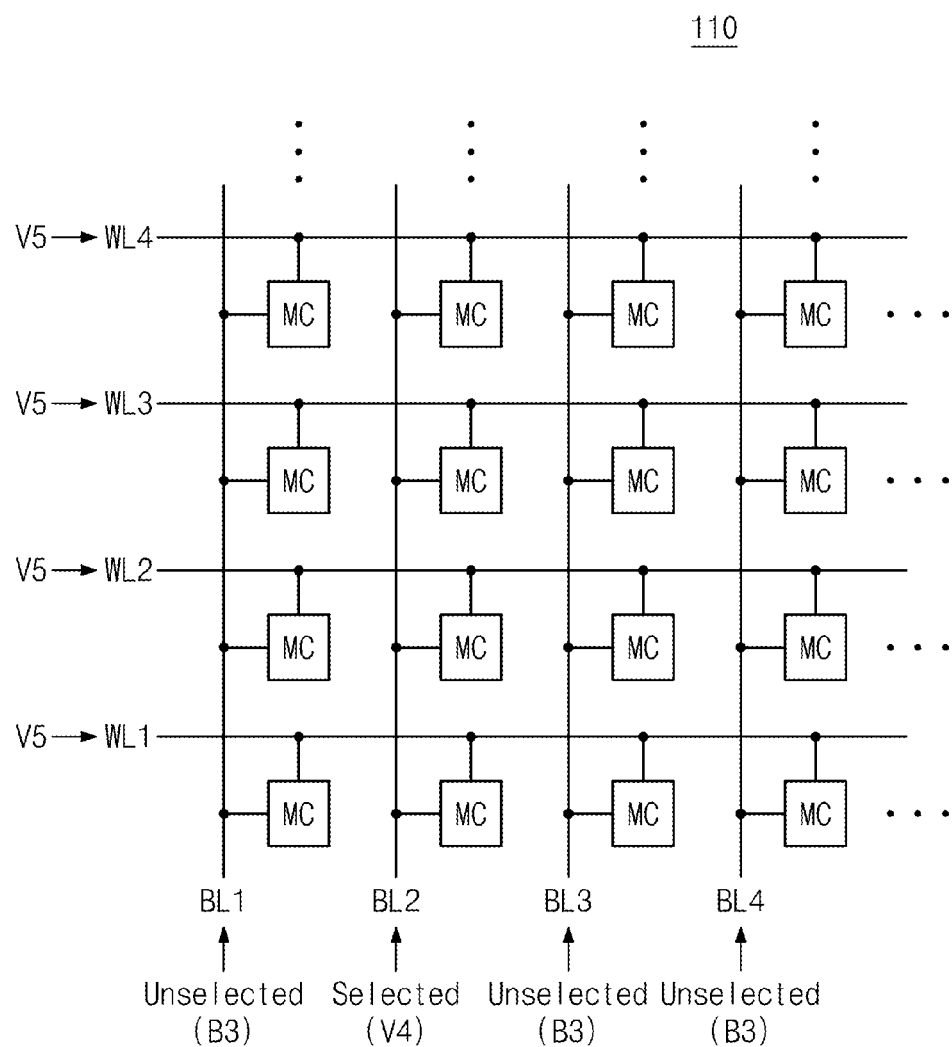
FIGS. 8 and 9 are respective annotated connection diagrams describing certain bias condition(s) for the memory cell array of FIG. 2 in relation to execution of the erase method of FIG. 7.
Figure 9:
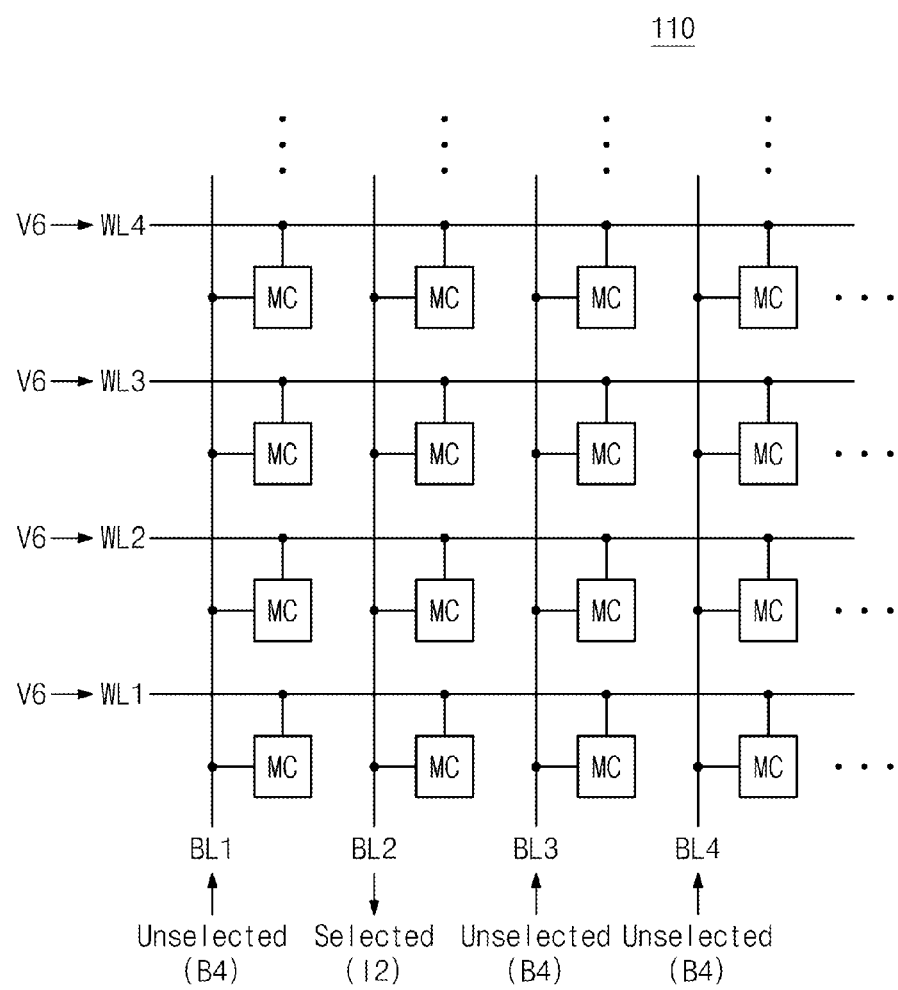

FIGS. 8 and 9 are respective annotated connection diagrams describing certain bias condition(s) for the memory cell array of FIG. 2 in relation to execution of the erase method of FIG. 7. In both examples, it is assumed that a second bit line BL2 is selected.

Referring to FIG. 8, a fourth voltage V4 is applied to the second bit line BL2, and a fifth voltage V5 is applied to word lines WL1 to WL4, where the fifth voltage V5 is greater than the fourth voltage V4. Under these bias conditions, current will flow to the second bit line BL2 from the word lines WL1 to WL4 via memory cells MC connected to the second bit line BL2, and the memory cells MC connected to the second bit line BL2 are erased.

Unselected bit lines BL1, BL3, and BL4 may be biased to a third (non-erase, or erase-inhibited) bias state B3 such that memory cells MC connected to the unselected bit lines BL1, BL3, and BL4 are not erased. The third bias state may be a floating state or a state that a specific voltage (e.g., the fifth voltage V5) is supplied.

Once the memory cells MC connected to the second bit line BL2 are erased, another bit line WL1, WL2, or WL4 may be selected, and the connected memory cells MC erased. That is, the plurality of bit lines BL1 to BL4 may be sequentially selected one by one, and the memory cells MC connected to the selected bit line may be simultaneously erased. Accordingly, the power capacity of the power supply 151 (FIG. 1) may be reduced.

In FIG. 8, there is illustrated an example that a bit line BL2 is selected. However, any reasonable number of bit lines may be selected and simultaneously erased in view of a given power capacity of the power supply 151.

FIG. 9 is a diagram describing another bias condition of a memory cell array according to an erase method in FIG. 7. Here again, it is assumed that the second bit line BL2 is selected.

Referring to FIG. 9, a second current I2 may be discharged from the second bit line BL2. A sixth voltage V6 may be applied to word lines WL1 to WL4. The sixth voltage V6 may be a ground voltage or a specific voltage. A current may flow to the second bit line BL2 from the word lines WL1 to WL4 via memory cells MC connected to the second bit line BL2. The memory cells MC connected to the second bit line BL2 may be erased by the applied voltage.

Unselected bit lines BL1, BL3, and BL4 may be biased to a fourth bias (non-erase or erase-inhibited) state B4 such that memory cells MC connected to the unselected bit lines BL1, BL3, and BL4 are not erased. The fourth bias state may be a floating state or a state that a specific voltage (e.g., the sixth voltage V6) is supplied.

Once the memory cells MC connected to the second bit line BL2 are erased, another bit line WL1, WL2, or WL4 may be selected, and then memory cells MC erased. That is, as the plurality of bit lines BL1 to BL4 are sequentially selected one by one, the memory cells MC connected to the selected bit line may be simultaneously erased. Accordingly, the power capacity of the power supply 151 may be reduced.

In FIG. 9, there is illustrated an example in which a single bit line BL2 is selected. However, any reasonable number of bit lines may be simultaneously selected according to a defined erase unit, so long as the power capacity of the power supply 151, for example, is properly taken into account.

After an erase operation is performed using a defined erase unit including at least one word line, or at least one bit line, an erase verification operation may be performed. The erase verification operation may include a step that determines whether the erased memory cells MC exhibit a target resistance value. For example, respective resistance values for the erased memory cells MC may be determined (judged) by detecting some variation in a voltage or current applied to the erased memory cells MC. "Erase-failed" memory cells identified by the erase verification operation may again erased. Then, another erase verification operation may be performed.

Like the erase operation(s) described above, an erase verification operation can be performed on an erase verification unit by erase verification unit basis, wherein each erase unit is defined by inclusion of at least one word line or at least one bit line. The defined erase verification unit may vary according to the power requirements of the resistive memory device 100. For example, when an amount of power consumed by an applied erase operation is greater than that required by an erase verification operation, the erase verification unit may be increased, such that the size of erase verification unit is greater than the size of the erase unit. In certain embodiments of the inventive concept, an erase operation may be performed according to an erase unit including at least one word line (or at least one bit line), but including less than all word lines (or all bit lines) included in a given memory block, while the erase verification unit is equal in size to the size of the memory block.

Stated in other terms, certain embodiments of the inventive concept provide a method of erasing resistive memory cells disposed in a particular memory block of a memory cell array. The memory block includes an arbitrary number of word lines ("M") and an arbitrary number of bit lines ("N"), M and N being positive integers. By appropriately defining an erase unit size, the method may simultaneously erase a first group of memory cells connected to one or more selected word line, as defined by the erase unit, wherein the erase unit includes a lesser number of word lines ("P") and/or a lesser number of bit lines ("Q") bit lines (i.e., at least one of the conditions P being less than M, and Q being less than N is true).

Thereafter, however, the erase verification of a second group of memory cells may performed, wherein the second group may be greater than the first group. That is, a greater erase verification unit size may be provided, as compared with the erase unit size.

Figure 10:
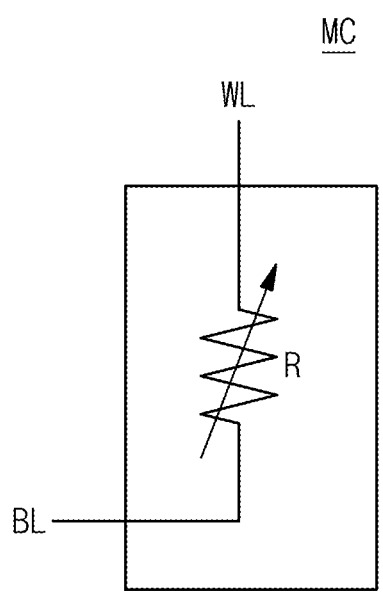
FIG. 10 is a diagram illustrating an individual memory cell according to an embodiment of the inventive concept.

FIG. 10 is a block diagram illustrating an individual memory cell that may be included in certain embodiments of the inventive concept. Referring to FIG. 10, a memory cell MC may have a variable resistor R. The variable resistor R may have a resistance value corresponding to a hysteresis curve in FIG. 3 according to a voltage or a current applied to a word line WL and a bit line BL.

Figure 11:
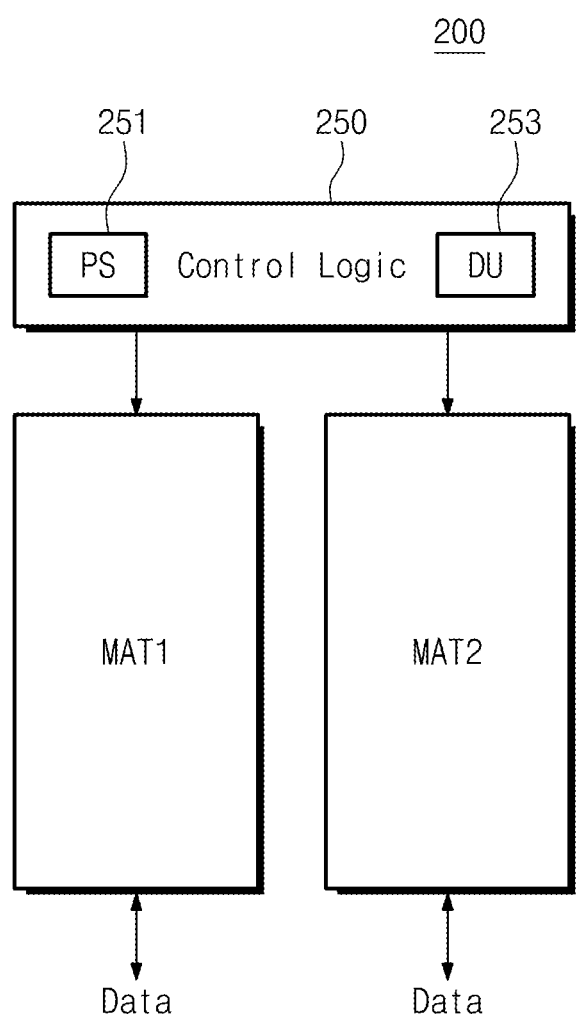
FIG. 11 is a block diagram illustrating a resistive memory device according to another embodiment of the inventive concept.

FIG. 11 is a block diagram illustrating a resistive memory device according to another embodiment of the inventive concept. Referring to FIG. 11, a resistive memory device 200 comprises a plurality of mats MAT1 and MAT2 and control logic 250.

Each of the mats MAT1 and MAT2 may include memory cell array 110, row selector 120, column selector 130, and write driver and sense amplifier block 140, as illustrated in FIG. 1. That is, the mats MAT1 and MAT2 may independently perform write, read, and/or erase operations. In certain embodiments, the mats MAT1 and MAT2 may be configured to include an address decoder 160 described in relation to FIG. 1, respectively. That is, each of the mats MAT1 and MAT2 may receive an address to perform a write operation, a read operation, or an erase operation according to the input address.

In other embodiments, the mats MAT1 and MAT2 may be configured to use an address decoder 160 described in relation to FIG. 1 in common. That is, an address decoder (not shown) may decode a row address and a column address of an input address to provide them to the mat MAT1 or MAT2.

The control logic 250 may be configured to control the mats MAT1 and MAT2. The control logic 250 may control the mats MAT1 and MAT2 so as to perform an erase operation by a unit of at least one word line or at least one bit line, as described in relation to FIGS. 4 to 9.

The control logic 250 may include a power supply (PS) 251 and a decision unit (DU) 253. The power supply 251 may supply a power to the mats MAT1 and MAT2. The decision unit 253 may adjust the number of word lines or bit lines that are simultaneously selected at erasing. That is, the decision unit 253 may be configured to adjust an erase unit.

In certain embodiments, the power supply 251 may commonly supply power to the mats MAT1 and MAT2. In the event that erasing, reading, or writing of the mat MAT1 is being performed before erasing of the mat MAT2 commences, the available power capacity of the second mat MAT2 may vary according to the power consumed by the first mat MAT1. The decision unit 253 may then dynamically determine an erase unit for the mat MAT2 according to the amount of available power capacity. For example, the decision unit 253 may reduce the size of the erase unit for the mat MAT2 from an entire memory block down to an erase unit including one or only several word lines (or bits lines) in accordance with the available power capacity.

In FIG. 11, there is illustrated an example wherein a resistive memory device 200 includes only two (2) mats MAT1 and MAT2. However, the number of mats included in the resistive memory device 200 is not limited thereto.

Figure 12:
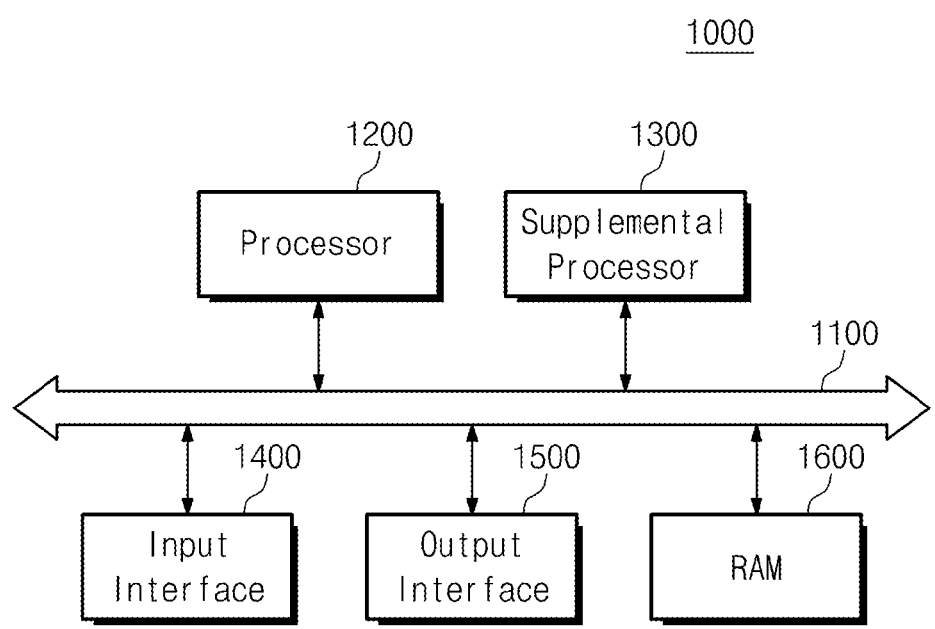
FIG. 12 is a block diagram illustrating a computing system that may incorporate an embodiment of the inventive concept.

FIG. 12 is a block diagram illustrating a computing system according to an embodiment of the inventive concept. Referring to FIG. 12, a computing system 1000 generally comprises a system bus 1100, a processor 1200, a supplemental processor 1300, an input interface 1400, an output interface 1500, and a RAM 1600. The system bus 1100 may provide channels among elements of the computing system 1000.

The processor 1200 may be configured to control an overall operation of the computing system 1000. The processor 1200 may include a general-purpose processor or an application processor.

The supplemental processor 1300 may be configured to supplement an operation of the processor 1200. The supplemental processor 1300 may include an image processor (or, CODEC), a sound processor (or, CODEC), a compression or de-compression processor (or, CODEC), an encoding or decoding processor (or, CODEC).

The input interface 1400 may include devices receiving signals from an external device. The input interface 1400 may include at least one input device such as a button, a keyboard, a mouse, a microphone, a camera, a touch panel, a touch screen, or a wire/wireless receiver.

The output interface 1500 may include devices outputting signals to the external. The output interface 1500 may include at least one output device such as a monitor, a ramp, a speaker, a printer, a motor, or a wire/wireless transmitter.

The RAM 1600 may be used as a working memory of the computing system 1000. The RAM 1600 may include a resistive memory device 100 or 200 according to an embodiment of the inventive concept described in relation to FIG. 1 or 11. When the resistive memory device 100 according to an embodiment of the inventive concept is applied to the computing system 1000, the maximum peak current demanded by the computing system 1000 may be reduced, and the complexity and/or size of the power system powering the computing system 1000 may be commensurately reduced.

Figure 13:
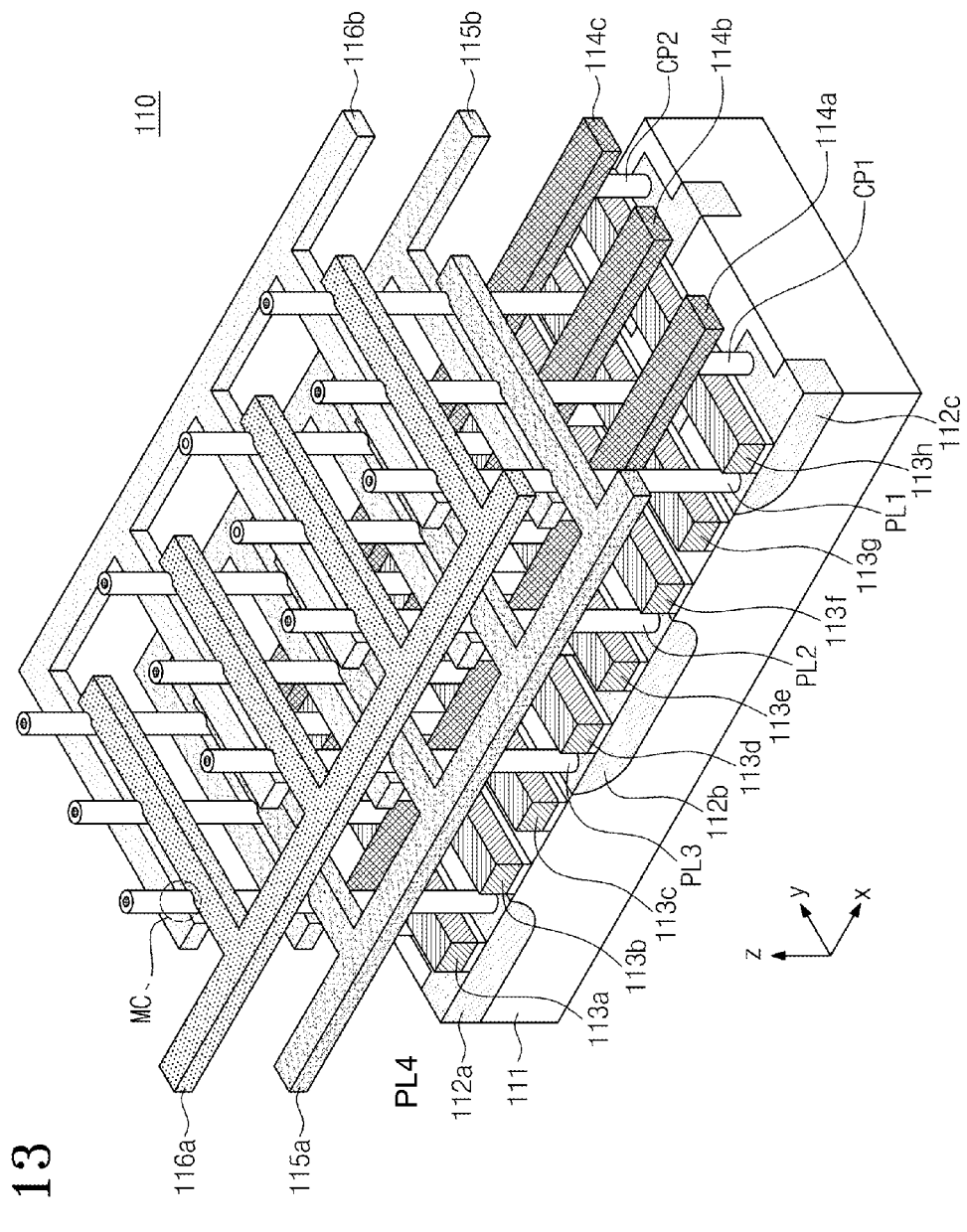
FIG. 13 is a perspective view illustrating one possible three-dimensional (3D) structure for the memory cell array of FIG. 1.

FIG. 13 is a perspective view illustrating one possible three-dimensional (3D) structure for the memory cell array in FIG. 1. Referring to FIG. 13, a memory cell array 110 may include structures (e.g., stacked semiconductor layers) extending in multiple directions x, y, and z.

A substrate 111 may be provided to form the memory cell array 110. For example, the substrate 111 may be formed of a p-well where element such as boron is injected. Alternatively, the substrate 111 may be a pocket p-well provided within an n-well. Hereinafter, it is assumed that the substrate 111 is a p-well. However, the substrate 111 is not limited thereto.

A plurality of doping regions 112a to 112c may be formed at the substrate 111. For example, the doping regions 112a to 112c may be formed of an n-type conductor different from the substrate 111. However, the inventive concept is not limited thereto. The doping regions 112a to 112c may be formed sequentially in the x-axis direction. This structure may be iterated in the y-axis direction. Word lines 113a to 113h connected to metal lines formed at multiple layers may be formed over the doping regions 112a to 112c to be electrically isolated from the doping regions 112a to 112c.

The doping regions 112a to 112c may be connected to multiple bit lines 114a to 114c extending in the x-axis direction by contact plugs CP1 and CP2. The doping regions 112a to 112c may be connected with the bit lines 114a to 114c and vertical electrodes of multiple pillars PL1 to PL4. That is, bit lines may be connected to vertical electrodes of the pillars PL1 to PL4 by the doping regions 112a to 112c. Each of the pillars PL1 to PL4 may be connected with metal lines 115a, 115b, 116a, and 116b stacked at multiple layers. The metal lines 115a and 115b connected to pillars at multiple metal layers in a comb shape may be connected to a global word line, respectively.

According to the above description, the memory cell array 110 of the resistive memory device may be formed to have a three-dimensional structure. However, the inventive concept is not limited thereto. Resistive memory cells can be stacked in various manners.

Figure 14:
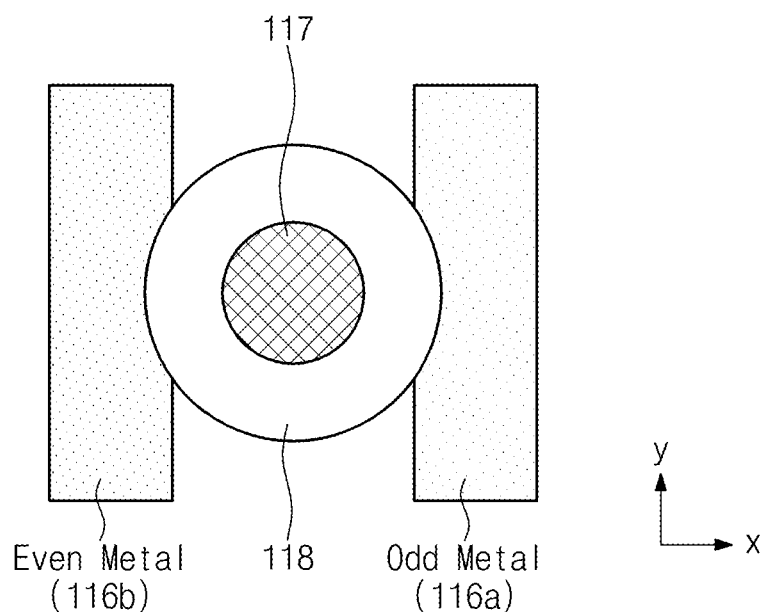
FIG. 14 is a cross-sectional view of an individual variable resistance memory cell formed at one layer of the 3D memory cell array of FIG. 13.

FIG. 14 is a cross-sectional view of a resistive memory cell formed at one layer in FIG. 13. Referring to FIG. 14, a memory cell MC may include a pillar 117 and 118 located between a first metal 116a and a second metal 116b.

A pillar penetrating in a direction (a z-axis direction) perpendicular to a substrate may be formed between the metal lines 116a and 116b forming a horizontal electrode. The pillar may include a data storing film 118 and a vertical electrode 117 that are formed in a cylindrical shape. A variable resistance memory cell may be formed by the vertical electrode 117 connected to a bit line and the metal lines 116a and 116b connected to a word line. The data storing film 118 may be formed by etch and deposition processes into a vertical direction. The vertical electrode 117 may be formed by a deposition process, for example, a PVD, CVD, or AVD manner.

Figure 15:
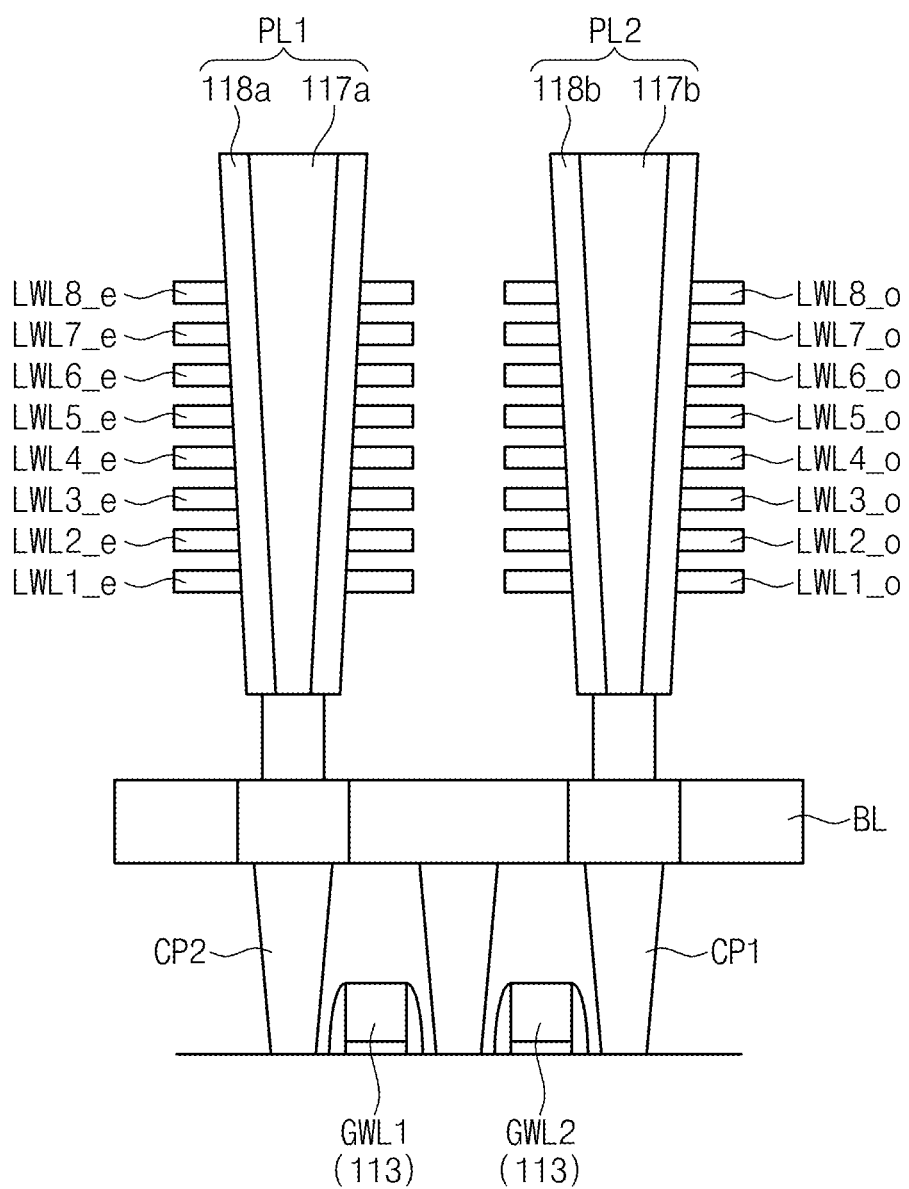
FIG. 15 is a cross-sectional view further illustrating the 3D memory cell array of FIG. 13.

FIG. 15 is a cross-sectional view further illustrating the memory cell array of FIG. 13. Referring to FIG. 15, a memory cell array may include pillars PL1 and PL2 forming a vertical electrode and a variable resistance memory cell; multiple horizontal electrodes LWL1_e to LWL8_e and LWL1_o to LWL8_o stacked in a direction perpendicular to a substrate; bit lines connected to bit lines via doping regions; and global word lines GWL1 and GWL2 (characterized generally as 113 for providing a word line voltage to multiple horizontal electrodes.

Figure 16:
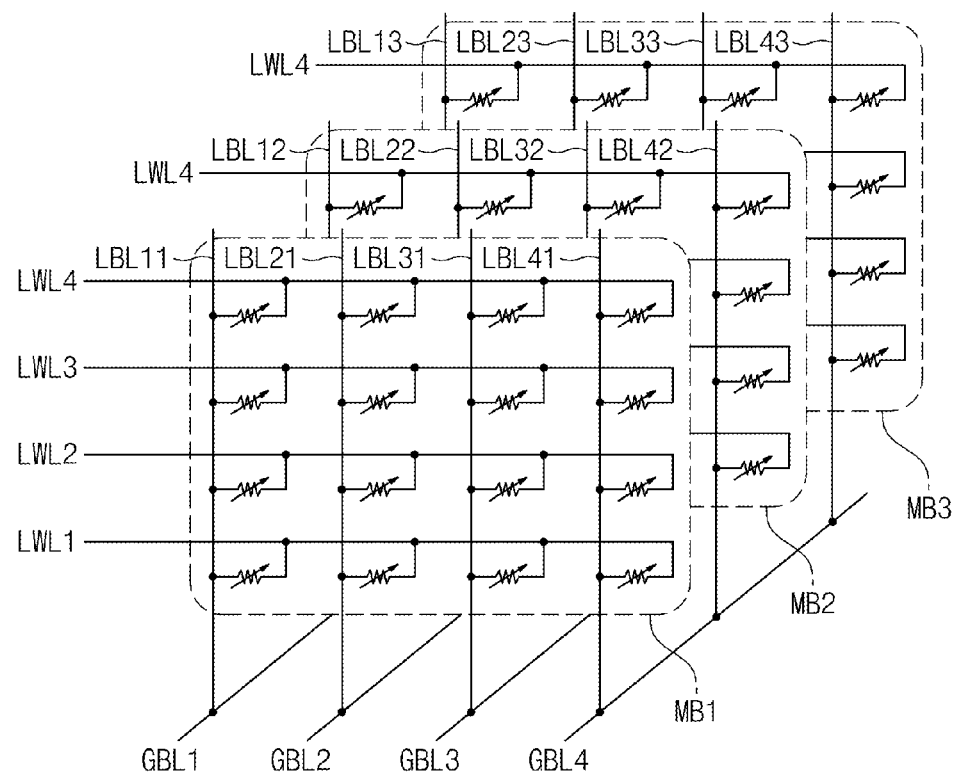
FIG. 16 is a circuit diagram further illustrating the 3D memory cell array of FIG. 13.

FIG. 16 is a circuit diagram still further illustrating the memory cell array of FIG. 13. Referring to FIG. 16, a memory cell array 110 may include multiple memory blocks MB1 to MB3 that form one unit at an x-z plane.

The memory cell array 110 may include multiple local bit lines extending in parallel in a z-axis direction and multiple local word lines LWL1 to LWL4 extending in parallel in a y-axis direction perpendicular to the z-axis direction. Although not shown in figures, each of the memory blocks MB1 to MB3 may be connected to different local word lines LWL.

Local bit lines LBL11 to LBL43 formed by vertical channels of pillars may be connected to global bit lines GBL1 to GBL4, respectively. Variable resistive memory cells of the memory cell array 110 may be connected to the local word lines LWL1 to LWL4 or the local bit lines LBL11 to LBL43. Variable resistive memory cells may be programmed or sensed by voltages applied to the local word lines LWL1 to LWL4 or the local bit lines LBL11 to LBL43.

While the inventive concept has been described with reference to exemplary embodiments, it will be apparent to those skilled in the art that various changes and modifications may be made without departing from the scope of the present inventive concept. Therefore, it should be understood that the above embodiments are not limiting, but illustrative.

What is claimed is:

1. A resistive memory device comprising:
a memory cell array including resistive memory cells connected to word lines and bit lines and arranged in memory blocks;
a row selector connected to the word lines;
a column selector connected to the bit lines;
an address decoder configured to decode a row address and a column address of an input address, transfer the decoded row address to the row selector, and transfer the decoded column address to the column selector;
a write driver and sense amplifier block connected to the bit lines via the column selector; and
a control logic configured to control the row selector, the column selector, and the write driver and sense amplifier block during an erase operation to simultaneously erase resistive memory cells connected to at least one selected word line included in an erase unit, wherein the erase unit includes fewer word lines than are included in a memory block,
wherein the control logic is further configured during the erase operation to control the row selector to apply a first voltage to the at least one selected word line while controlling the column selector to bias at least one bit line such that current flows via the resistive memory cells connected to the at least one selected word line, and
wherein the control logic is further configured to control the column selector to apply a second voltage less than the first voltage to the at least one bit line.

2. The resistive memory device of claim 1, wherein the control logic is further configured to control the row selector to bias unselected word lines such that memory cells connected to the unselected word lines are not erased.

3. The resistive memory device of claim 2, wherein the control logic is further configured to control the row selector to float the unselected word lines.

4. The resistive memory device of claim 2, wherein the control logic is further configured to control the row selector to apply voltages to the unselected word lines.

5. The resistive memory device of claim 1, wherein the control logic is further configured to control the row selector during an erase verification operation following the erase operation to simultaneously apply voltages to a plurality of word lines, the plurality of word lines including the at least one selected word line and being more than the at least one selected word line.

6. The resistive memory device of claim 5, wherein the plurality of word lines includes all of the word lines included in the memory block.

7. A resistive memory device comprising:
a memory cell array including resistive memory cells connected to word lines and bit lines and arranged in memory blocks;
a row selector connected to the word lines;
a column selector connected to the bit lines;
an address decoder configured to decode a row address and a column address of an input address, transfer the decoded row address to the row selector, and transfer the decoded column address to the column selector;
a write driver and sense amplifier block connected to the bit lines via the column selector; and
a control logic configured to control the row selector, the column selector, and the write driver and sense amplifier block during an erase operation to simultaneously erase resistive memory cells connected to at least one selected word line included in an erase unit, wherein the erase unit includes fewer word lines than are included in a memory block,
wherein the control logic is further configured during the erase operation to control the row selector to supply a current to the at least one selected word line, and control the column selector to bias at least one bit line such that current flows via the resistive memory cells connected to the at least one selected word line, and
wherein the control logic is further configured to control the row selector to bias unselected word lines such that memory cells connected to the unselected word lines are not erased.

8. The resistive memory device of claim 7, wherein the control logic is further configured to control the column selector to apply a specific voltage to the at least one bit line.

9. The resistive memory device of claim 7, wherein the control logic is further configured to control the row selector during an erase verification operation following the erase operation to simultaneously apply voltages to a plurality of word lines, the plurality of word lines including the at least one selected word line and being more than the at least one selected word line.

10. The resistive memory device of claim 9, wherein the plurality of word lines includes all of the word lines included in the memory block.

11. A method of erasing resistive memory cells of a memory cell array, the memory cells being arranged in a plurality of memory blocks, each memory block including "M" word lines and "N" bit lines, M and N being positive integers, and the method comprising:

simultaneously erasing a first group of resistive memory cells connected to at least one selected word line included in an erase unit, wherein the erase unit includes "P" selected word lines and "Q" bit lines, wherein P and N are positive integers and wherein at least one of P being less than M and Q being less than N is true; and thereafter, verifying that a second group of resistive memory cells has been erased, wherein the second group is equal to or greater than the first group, wherein the simultaneously erasing of the first group of resistive memory cells comprises applying a first voltage to the at least one selected word line while applying a second voltage less than the first voltage to at least one bit line, and biasing word lines other than the at least one selected word line to a floating state.

12. The method of claim 11, wherein the erase unit includes a single word line.

13. The method of claim 11, wherein the memory cell array is a three-dimensional cell array.

14. The resistive memory device of claim 11, wherein the verifying includes applying voltages to a plurality of word lines, the plurality of word lines including the at least one selected word line and being more than the at least one selected word line.

* * * * *